(12) United States Patent
Zhang et al.

(10) Patent No.: US 7,544,997 B2
(45) Date of Patent: Jun. 9, 2009

(54) MULTI-LAYER SOURCE/DRAIN STRESSOR

(75) Inventors: Da Zhang, Austin, TX (US);
Veeraraghavan Dhandapani, Round Rock, TX (US); Darren V. Goedeke, Pflugerville, TX (US); Jill C. Hildreth, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 114 days.

(21) Appl. No.: 11/676,114

(22) Filed: Feb. 16, 2007

(65) Prior Publication Data

US 2008/0197412 A1    Aug. 21, 2008

(51) Int. Cl.
*H01L 29/78* (2006.01)

(52) U.S. Cl. .................. 257/344; 257/200; 257/616; 257/E21.092; 257/E21.102; 257/E21.182

(58) Field of Classification Search .................. 257/344, 257/200, 616, E21.092, E21.102, E21.182
See application file for complete search history.

(56) References Cited

U.S. PATENT DOCUMENTS

| 6,621,131 | B2 |   | 9/2003 | Murthy et al. |
| 7,176,481 | B2 | * | 2/2007 | Chen et al. ............... 257/19 |
| 2006/0065914 | A1 |   | 3/2006 | Chen et al. |
| 2006/0134873 | A1 | * | 6/2006 | Koontz ............... 438/301 |
| 2007/0004123 | A1 |   | 1/2007 | Bohr et al. |

FOREIGN PATENT DOCUMENTS

| JP | 2007036205 A | 2/2007 |
| WO | 2005124837 A1 | 12/2005 |

OTHER PUBLICATIONS

PCT Search report and Written Opinion for corresponding PCT Application No. PCT/US08/51841 mailed May 29, 2008.

* cited by examiner

*Primary Examiner*—Ngan Ngo
*Assistant Examiner*—Benjamin Tzu-Hung Liu
(74) *Attorney, Agent, or Firm*—James L. Clingan, Jr.; Ranjeev K. Singh

(57) ABSTRACT

A method for forming a semiconductor device includes forming a recess in a source region and a recess in a drain region of the semiconductor device. The method further includes forming a first semiconductor material layer in the recess in the source region and a second semiconductor material layer in the recess in the drain region, wherein each of the first semiconductor material layer and the second semiconductor material layer are formed using a stressor material having a first ratio of an atomic concentration of a first element and an atomic concentration of a second element, wherein the first element is silicon and a first level of concentration of a doping material. The method further includes forming additional semiconductor material layers overlying the first semiconductor material layer and the second semiconductor material layer that have a different ratio of the atomic concentration of the first element and the second element.

20 Claims, 3 Drawing Sheets

MULTI-LAYER SOURCE/DRAIN STRESSOR

BACKGROUND

1. Field

This disclosure relates generally to integrated circuits, and more specifically, to integrated circuits having a multi-layer source/drain stressor.

2. Related Art

One of the techniques for improving N channel and P channel transistor performance is by introducing strain to the channel. One of the techniques to introduce strain is to remove semiconductor material from the source/drain locations and regrowing a semiconductor material epitaxially which is of a different composition. For example, one approach for improving P channel performance, where the initial semiconductor material and thus the channel is just silicon, is regrowing a combination of silicon and germanium (SiGe) in the source/drain regions which exerts a compressive stress on the channel. One of the difficulties is that the amount of stress being exerted is dependent on the germanium concentration but increasing the germanium concentration can cause the formation of defects which then causes a reduction in the stress being exerted. In addition, as the device dimension shrinks during the technology evolution, one critical challenge is to maintain good performance characteristics for short channel transistors.

Thus, there is a need for improving on the technique for regrowing the source/drains to provide stress to the channel.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, source/drains regions adjacent to a gate are removed and regrown using multiple layers of a different semiconductor combination. In one embodiment the semiconductor combination is an alloy of silicon and germanium (SiGe). The first layer has a first concentration of germanium and is doped with a first concentration of boron. Growth of the first layer is terminated before defects begin occurring. A first subsequent layer is grown at reduced germanium concentration which would not have defects until a second thickness is reached in which the second thickness is greater than the first thickness. The first subsequent layer is grown without defects and is boron-doped to a second concentration of boron greater than the first concentration of boron. A second subsequent layer is then grown at increased germanium concentration compared to the first subsequent layer and which is grown to a sufficiently low thickness so that there are substantially no defects. The boron doping is further increased in the second subsequent layer. Thus, the first subsequent layer provides defect relief against the high germanium concentration layers of the first layer and the second subsequent layer. The boron is increased as distance from the channel is increased to avoid adverse short channel effects. This is further explained in the following description and the drawings.

Figure 1:
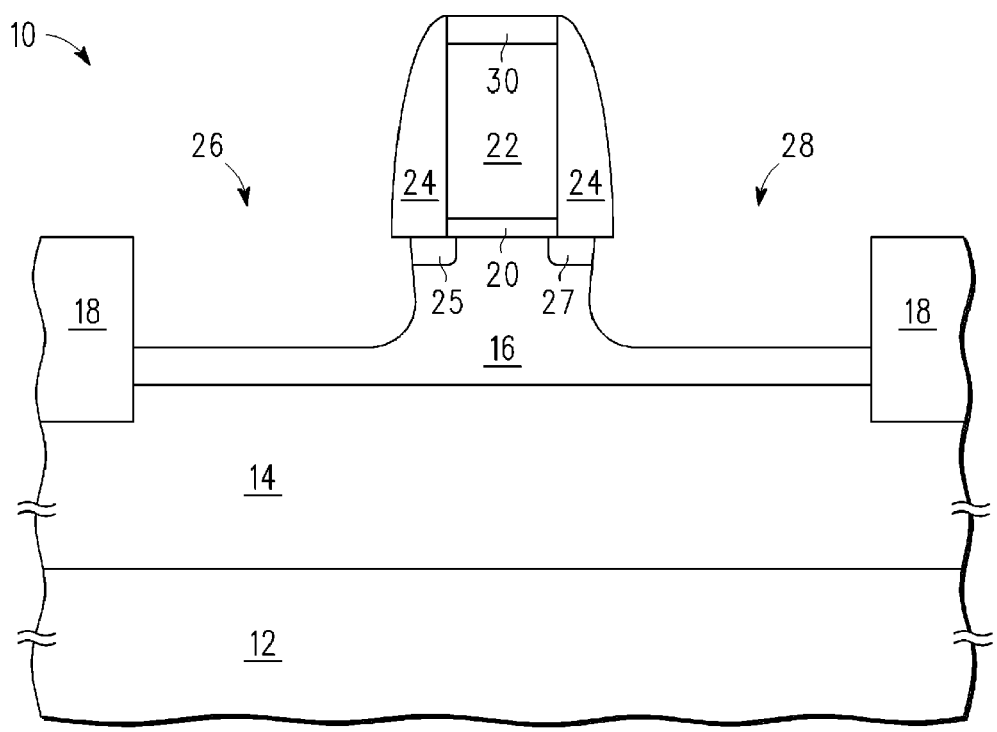
FIG. 1 is a cross section of a semiconductor device at a stage in processing according to an embodiment of the invention.

Shown in FIG. 1 is a semiconductor device 10 comprising a semiconductor substrate 12, an insulating layer 14 over substrate 12, a semiconductor region 16 over insulating layer 14, a trench isolation region 18 surrounding semiconductor region 16, a gate 22 overlying a center portion semiconductor region 16, a sidewall spacer 24 surrounding gate 22, an insulating cap 30 over gate 22, a gate dielectric between gate 22 and semiconductor region 16, a source/drain extension 25 adjacent to one side of gate 22 in a top surface of semiconductor region 16, and a source/drain extension 27 on the other side of gate 22 on the top surface of semiconductor region 16. The region between source/drain extensions 25 and 27, which is along the top surface of semiconductor region 16 and under gate 22, will function as a channel. This structure of FIG. 1 arises from forming gate 22, performing an implant to form source/drain extensions 25 and 27, forming sidewall spacer 24, and removing portions of semiconductor 16 using trench isolation region 18, gate 22, cap 30, and sidewall spacer 24 as a mask to result in an opening 26 adjacent to gate 22 on one side and opening 28 adjacent to gate 22 on the other side. This etch can be isotropic, preferably a dry isotropic etch, so that portions of openings 26 and 28 are under sidewall spacer 24. While this etch is occurring the N channel transistors are masked off and thus are not etched. Sidewall spacer is shown as one material formed by a conformal deposition followed by an anistropic etch but it may be formed in several layers and may include a liner. As an alternative It may be formed simply as a liner rather than one or more sidewall spacers. One example is a nitride spacer with an oxide liner between the nitride spacer and gate 22 as well as between the nitride spacer and semiconductor region 16. Semiconductor region 16 in this described example is just silicon, as the semiconductor material, that may have background doping and other dopings such as a halo implant. The principles described may have applicability with other semiconductor materials as well. An exemplary thickness for semiconductor region 16 from insulating layer 14 to gate dielectric 20 is about 500 Angstroms. An exemplary depth for openings 26 and 28 is 350 Angstroms. The combination of substrate 12, insulating layer 14, and semiconductor region makes up what is commonly called an SOI (semiconductor on insulator) substrate. Insulating layer 14 is commonly referred to as a BOX (buried oxide). This process may also be effective for a bulk silicon substrate in which the insulating layer is not present. Trench isolation 18 provides electrical isolation for the transistor or transistors that it surrounds.

Figure 2:
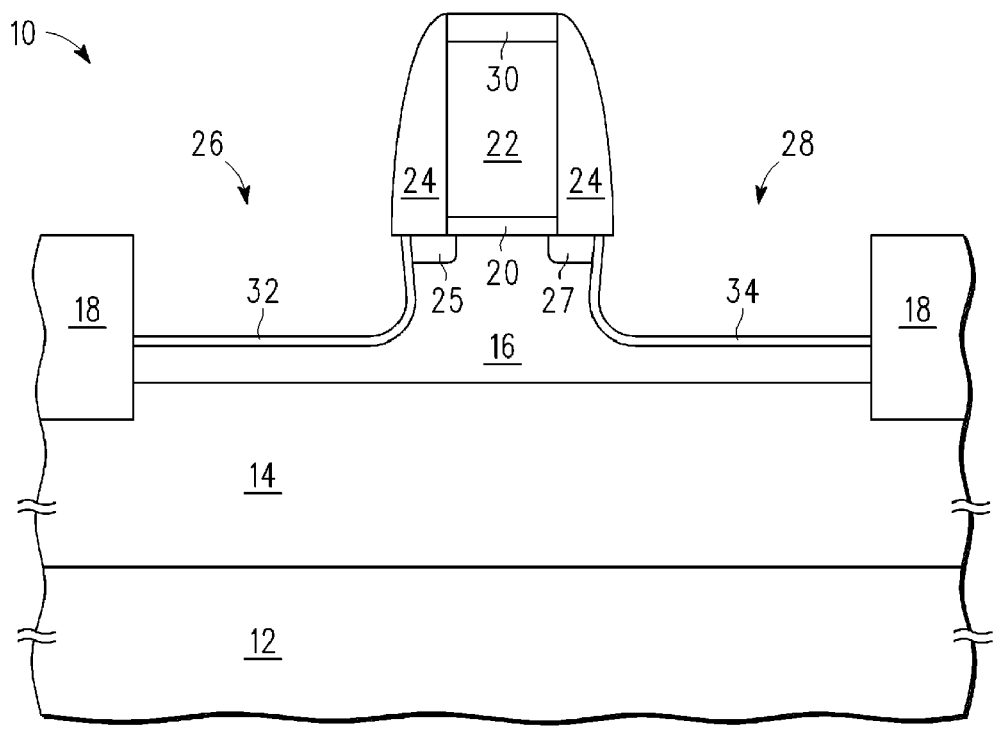
FIG. 2 is a cross section of the semiconductor device of FIG. 1 at a subsequent stage in processing.

Shown in FIG. 2 is semiconductor device 10 after epitaxially growing a semiconductor layer 32 on semiconductor region 16 in opening 26 and semiconductor layer 34 on semiconductor region 16 in opening 28. Semiconductor layers 32 and 34 are about 50 Angstroms thick in this example and are boron-doped SiGe. The concentration of Ge is about 30 atomic percent (%). This is a Si to Ge ratio of 2.3 to 1. The boron doping in this example is from about 5e19 ($5 \times 10^{19}$)"

atoms per cubic centimeter (atoms/cc) to about 2e20 ($2\times10^{20}$) atoms/cc. At 30% germanium, semiconductor layers 32 and 34 can be grown to 50 Angstroms directly on just silicon without developing defects. Avoiding defects is important because defects tend to relax the layer where they are. If that occurs, that defeats the primary purpose of growing the layers of generating stress on the channel. The relatively high Ge % in the first grown layers (layers 32 and 34) is important in retarding dopant diffusion into the channel region to improve short channel device control. The reason is that dopant (e.g., Boron) diffusivity is significantly reduced in SiGe with high Ge % than in Si. The boron concentration of about 5e19 atoms/cc to 2e20 atoms/cc is a relatively low concentration that further reduces the boron diffusing into the channel to reduce short channel effects. Also by including boron in the epitaxial growth, this avoids the need for implanting. Implanting also tends to generate the type of defects that cause relaxation so is preferably avoided. The thickness of layer 32 may not be uniform in the lateral and vertical directions because the upward growth tends to be faster than lateral growth.

Figure 3:
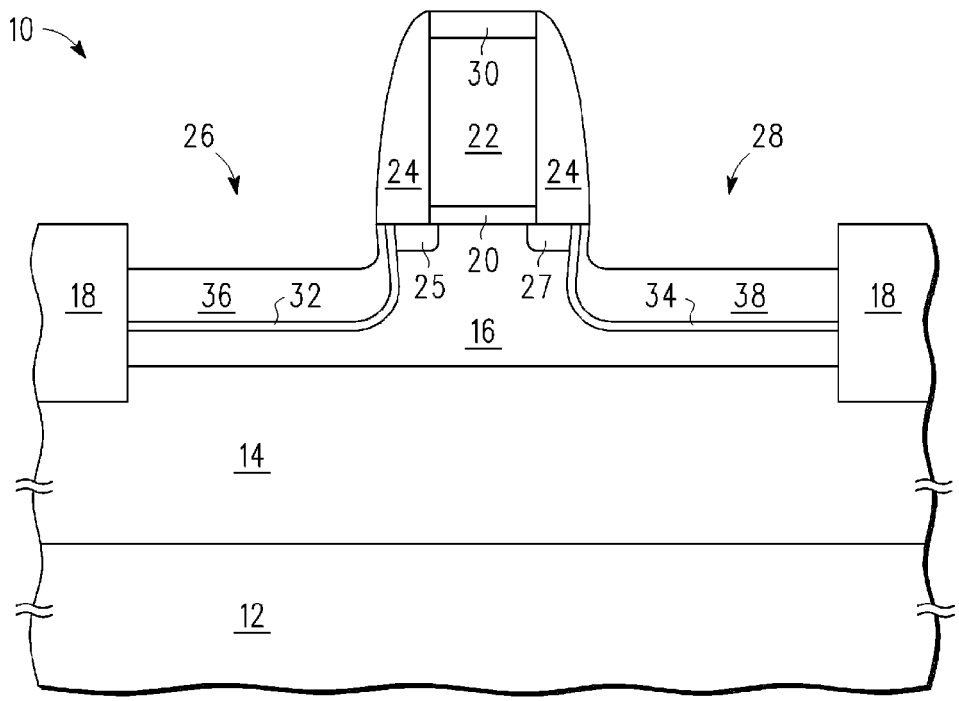
FIG. 3 is a cross section of the semiconductor device of FIG. 2 at a subsequent stage in processing.

Shown in FIG. 3 is semiconductor device 10 after epitaxially growing a semiconductor layer 36 on semiconductor layer 32 and epitaxially growing a semiconductor layer 38 on semiconductor layer 34. Semiconductor layers 36 and 38 are, in this example, about 250 Angstroms and are also boron-doped SiGe. In this layer the germanium content is about 25% (Si to Ge ratio of 3 to 1) and the boron concentration is from about 2e20/cc to 5e20/cc. This reduction in germanium concentration supports the increase of stressor film thickness without generating defects. The increase in boron concentration is for increasing conductivity but the risk in generating short channel problems is reduced by being further from the channel. The lateral growth is low as the growth continues so the thickness of semiconductor layers 36 and 38 in the lateral direction is much less than the 250 Angstrom growth in the upward direction.

Figure 4:
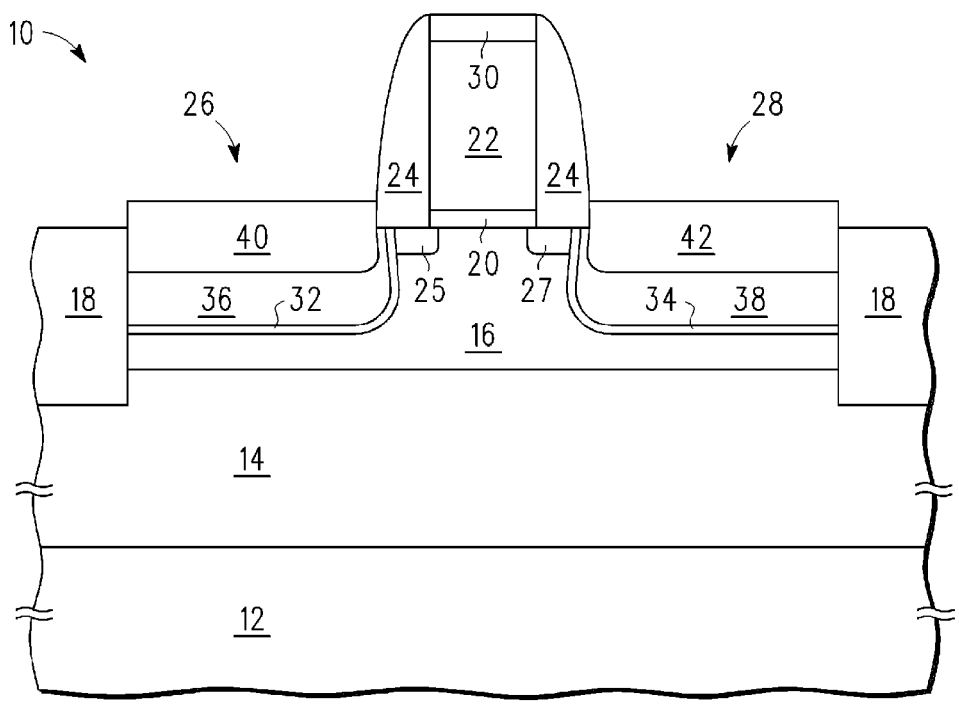
FIG. 4 is a cross section of the semiconductor device of FIG. 3 at a subsequent stage in processing.

Shown in FIG. 4 is semiconductor device 10 after epitaxially growing a semiconductor layer 40 on semiconductor layer 36 and epitaxially growing a semiconductor layer 42 on semiconductor layer 38. Semiconductor layers 40 and 42 are, in this example, about 300 Angstroms and are also boron-doped SiGe. In this layer the germanium content is about 30% and the boron concentration is from about 5e20/cc to 1e21/cc. This increase in germanium concentration increases the stress that is generated and can be thicker than semiconductor layers 32 and 34 because they are grown on SiGe instead of just Si, and further, the upper portion of semiconductor layers 40 and 42 can have defects without causing adverse affects because the upper portion is converted to a metal alloy in a subsequent step. The increased Ge and boron concentrations at top layers 40 and 42 reduces contact resistance.

Figure 5:
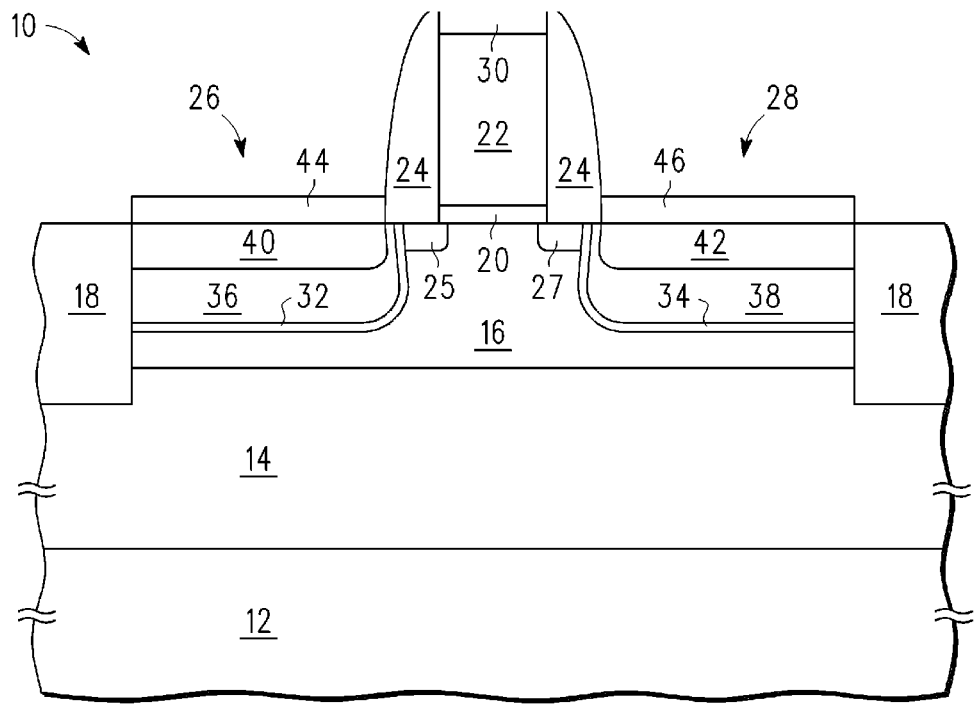
FIG. 5 is a cross section of the semiconductor device of FIG. 4 at a subsequent stage in processing.

Shown in FIG. 5 is semiconductor device 10 after converting the upper portion of semiconductor layers 40 and 42 to metal germanium silicide layers 44 and 46. This conversion of a top portion of source/drain region to a silicide is a common practice for forming contacts. The increased Ge and boron concentrations at top layers 40 and 42 reduces contact resistance at the silicide-semiconductor interface. With germanium present in the semiconductor, the resulting metal silicide alloy includes silicon and germanium. Any defects in semiconductor layers 40 and 42 that are ultimately consumed in the metallization process to form metal germanium silicide layers 44 and 46 do not cause adverse effects.

Figure 6:
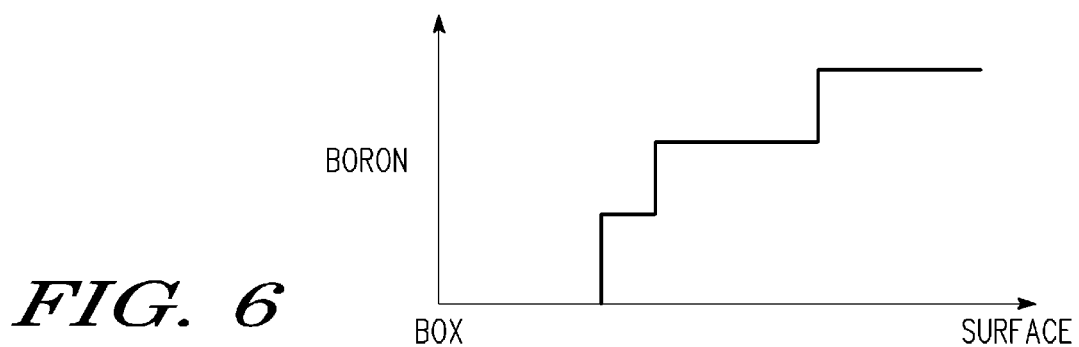
FIG. 6 is a graph showing relative boron concentration in a semiconductor region, which includes epitaxially grown regions, of the semiconductor device of FIG. 5.

Shown in FIG. 6 is a graph showing the increase in boron concentration from the top of insulating layer 14 to the top surface of semiconductor layers 40 and 42. The abrupt change in boron concentration at the interface with semiconductor layer 16 is beneficial because it causes an abrupt PN junction which is better for reducing leakage across the PN junction as well as reducing junction capacitance.

Figure 7:
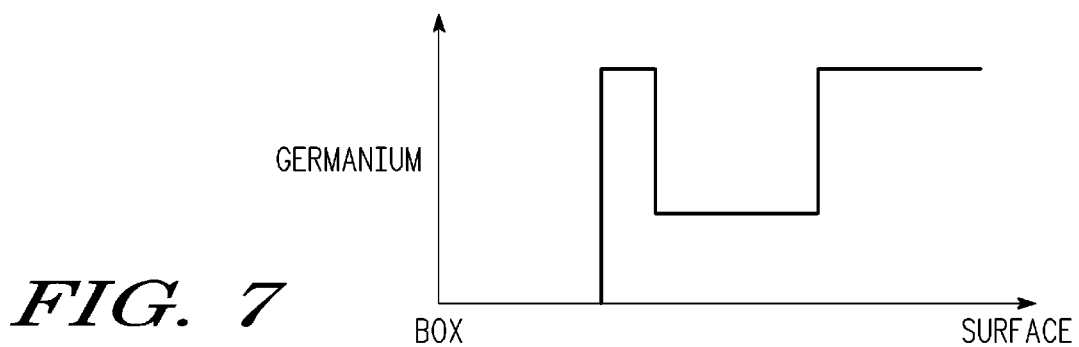
FIG. 7 is a graph showing relative germanium concentration in the semiconductor region of the semiconductor device of FIG. 5.

Shown in FIG. 7 is a graph showing the changes in germanium concentration from the top of insulating layer 14 to the top surface of semiconductor layers 40 and 42. The scale does not begin at zero but shows the initial high concentration, the reduced intermediate concentration, and the final high concentration. This is an efficient way of achieving the desired result of high stress in the stressor with low defects.

Thus, it is seen that by altering the concentration of germanium in multiple layers it is possible to have the stressor provide a greater stress while reducing the risk of generating defects. The effectiveness is dependent both the germanium concentration and the thicknesses chosen. As the germanium concentration rises the thickness will need to be reduced, especially for concentrations over 30%. If higher concentration is used, it may be beneficial to provide additional layers of alternating germanium concentration. Further, by increasing the boron concentration as the layers are added the risk of short channel effects are reduced while obtaining good conductivity.

Thus described is a method for forming a semiconductor device. The method comprises forming a recess in a source region and a recess in a drain region of the semiconductor device, forming a first semiconductor material in the source region and second semiconductor material layer in the recess of the drain region, a third semiconductor material, and a fifth semiconductor material, forming a third semiconductor material layer overlying the first semiconductor material layer and a fourth semiconductor material layer overlying the second semiconductor material layer, and forming a fifth semiconductor material layer overlying the third semiconductor material layer and a sixth semiconductor material layer overlying the fourth semiconductor material layer. The step of forming the first and second semiconductor material layer is further characterized by each of the first semiconductor material layer and the second semiconductor material layer being formed using a stressor material having a first ratio of an atomic concentration of a first element and an atomic concentration of a second element, wherein the first element is silicon and a first level of concentration of a doping material. The step of forming the third and fourth semiconductor layers is further characterized by each of the third semiconductor material layer and the fourth semiconductor material layer having a second ratio of the atomic concentration of the first element and the atomic concentration of the second element, wherein the second ratio is higher than the first ratio and wherein each of the third semiconductor material layer and the fourth semiconductor material layer have a second level of concentration of the doping material, wherein the second level of concentration of the doping material is higher than the first level of concentration of the doping material. The step of forming the fifth and sixth semiconductor material layers is further characterized by each of the fifth semiconductor material layer and the sixth semiconductor material layer having a third ratio of the atomic concentration of the first element and the atomic concentration of the second element, wherein the third ratio is lower than the second ratio and wherein each of the fifth semiconductor material layer and the sixth semiconductor material layer have a third level of concentration of the doping material, wherein the third level of concentration of the doping material is higher than the second level of concentration of the doping material. The method may be further characterized by the stressor material being an alloy of silicon and germanium such that the second element is germanium. The method may be further characterized by the doping material being one or more of a group V element in the periodic table. The method may be further characterized by the first ratio of the atomic concentration of the first element to the atomic concentration of the second element being about 2.3 to 1. The method may be further characterized by the doping material being boron and the first level of concentration of the doping material being from about 5e19 atoms per $cm^3$ to about 2e20 atoms per cubic centimeter. The method may be further characterized by the second ratio of the atomic concentration of the first element to the atomic concentration of the second element being about 3.0 to 1. The method may be further characterized by the doping material being boron and the second level of concentration of the doping material being from about 2e20 atoms per $cm^3$ to 5e20 atoms per cubic centimeter. The method may be further characterized by the third ratio of the atomic concentration of the first element to the atomic concentration of the second element being about 2.3 to 1. The method may be further characterized by the doping material being boron and the third level of concentration of the doping material being in a range from about 5e20 atoms per $cm^3$ to 1e21 atoms per $cm^3$.

Also described is a method for forming a semiconductor device comprising forming a recess in a source region and a recess in a drain region of the semiconductor device, forming a first semiconductor material layer in the recess in the source region and a second semiconductor material layer in the recess in the drain region, forming a third semiconductor material layer overlying the first semiconductor material layer and a fourth semiconductor material layer overlying the second semiconductor material layer, and forming a fifth semiconductor material layer overlying the third semiconductor material layer and a sixth semiconductor material layer overlying the fourth semiconductor material layer. The step of forming the first and second semiconductor material layers is further characterized by each of the first semiconductor material layer and the second semiconductor material layer being formed using a stressor material having a first ratio of an atomic concentration of a first element and an atomic concentration of a second element, wherein the first element is silicon and wherein each of the first semiconductor material layer and the second semiconductor material layer have a first level of concentration of a doping material. The step of forming the third and fourth semiconductor material layers is further characterized by each of the third semiconductor material layer and the fourth semiconductor material layer have a second level of concentration of the doping material, wherein the second level of concentration of the doping material is higher than the first level of concentration of the doping material. The step of forming the fifth and sixth semiconductor material layers is further characterized by each of the fifth semiconductor material layer and the sixth semiconductor material layer having a third level of concentration of the doping material, wherein the third level of concentration of the doping material is higher than the second level of concentration of the doping material. The method may be further characterized by the doping material being one or more of a group V element in the periodic table. The method may be further characterized by the doping material being boron and the first level of concentration of the doping material being from about 5e19 atoms per $cm^3$ to about 2e20 atoms per $cm^3$. The method may be further characterized by the second level of concentration of the doping material is from about 2e20 atoms per $cm^3$ to 5e20 atoms per $cm^3$. The method may be further characterized by the third level of concentration of the doping material being in a range from about 5e20 atoms per $cm^3$ to 1e21 atoms per $cm^3$.

Also described is a semiconductor comprising a a first semiconductor material layer in a recess in a source region and a second semiconductor material layer in a recess in a drain region; a third semiconductor material layer overlying the first semiconductor material layer and a fourth semiconductor material layer overlying the second semiconductor material layer; and a fifth semiconductor material layer overlying the third semiconductor material layer and a sixth semiconductor material layer overlying the fourth semiconductor material layer. The first and second semiconductor material layers are further characterized by each of the first semiconductor material layer and the second semiconductor material layer using a stressor material having a first ratio of an atomic concentration of a first element and an atomic concentration of a second element and a first level of concentration of a doping material, wherein the first element is silicon. The third and fourth semiconductor material layers being further characterized by each of the third semiconductor material layer and the fourth semiconductor material layer having a second ratio of the atomic concentration of the first element and the atomic concentration of the second element, wherein the second ratio is higher than the first ratio and wherein each of the third semiconductor material layer and the fourth semiconductor material layer have a second level of concentration of the doping material, wherein the second level of concentration of the doping material is higher than the first level of concentration of the doping material. The fifth and sixth semiconductor material layers being further characterized by each of the fifth semiconductor material layer and the sixth semiconductor material layer having a third ratio of the atomic concentration of the first element and the atomic concentration of the second element, wherein the third ratio is lower than the second ratio and wherein each of the fifth semiconductor material layer and the sixth semiconductor material layer have a third level of concentration of the doping material, wherein the third level of concentration of the doping material is higher than the second level of concentration of the doping material. The semiconductor device may be further characterized by the stressor material being an alloy of silicon and germanium such that the second element is germanium. The semiconductor device may be further characterized by the doping material being one or more of a group V element in the periodic table. The semiconductor device may be further characterized by the first ratio of the atomic concentration of the first element to the atomic concentration of the second element being about 2.3 to 1. The semiconductor device may be further characterized by the doping material being boron and the first level of concentration of the doping material being from about 5e19 atoms per $cm^3$ to about 2e20 atoms per $cm^3$, the second level of concentration of the doping material being from about 2e20 atoms per $cm^3$ to 5e20 atoms per $cm^3$, and the third level of concentration of the doping material being in a range from about 5e20 atoms per $cm^3$ to 1e21 atoms per $cm^3$. The semiconductor device may be further characterized by the second ratio of the atomic concentration of the first element to the atomic concentration of the second element being about 3.0 to 1.

Although the invention is described herein with reference to specific embodiments, various modifications and changes can be made without departing from the scope of the present invention as set forth in the claims below. For example, rather than adding stress to P channel transistors, stress may be added to N channel transistors by exerting tensile stress on the channels of the N channel transistors in a similar manner of providing source/drain stressors. This may be achievable by regrowing silicon carbon and altering the concentration of carbon in different layers to provide the desired stress while avoiding defect creation. Further it may be beneficial to increase the N channel dopant in layers as well analogous to increasing the boron dopant for the P channel transistors. Although this may be less necessary for the case where the dopant is arsenic, due to its lower rate of diffusion, there may still some benefit. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for forming a semiconductor device comprising:
    forming a recess in a source region and a recess in a drain region of the semiconductor device;
    forming a first semiconductor material layer in the recess in the source region and a second semiconductor material layer in the recess in the drain region, wherein each of the first semiconductor material layer and the second semiconductor material layer are formed using a stressor material having a first ratio of an atomic concentration of a first element and an atomic concentration of a second element, wherein the first element is silicon and a first level of concentration of a doping material;
    forming a third semiconductor material layer overlying the first semiconductor material layer and a fourth semiconductor material layer overlying the second semiconductor material layer, wherein each of the third semiconductor material layer and the fourth semiconductor material layer have a second ratio of the atomic concentration of the first element and the atomic concentration of the second element, wherein the second ratio is higher than the first ratio and wherein each of the third semiconductor material layer and the fourth semiconductor material layer have a second level of concentration of the doping material, wherein the second level of concentration of the doping material is higher than the first level of concentration of the doping material; and
    forming a fifth semiconductor material layer overlying the third semiconductor material layer and a sixth semiconductor material layer overlying the fourth semiconductor material layer, wherein each of the fifth semiconductor material layer and the sixth semiconductor material layer have a third ratio of the atomic concentration of the first element and the atomic concentration of the second element, wherein the third ratio is lower than the second ratio and wherein each of the fifth semiconductor material layer and the sixth semiconductor material layer have a third level of concentration of the doping material, wherein the third level of concentration of the doping material is higher than the second level of concentration of the doping material.

2. The method of claim 1, wherein the stressor material is an alloy of silicon and germanium such that the second element is germanium.

3. The method of claim 1, wherein the doping material is one or more of a group V element.

4. The method of claim 3, wherein the first ratio of the atomic concentration of the first element to the atomic concentration of the second element is about 2.3 to 1.

5. The method of claim 3, wherein the doping material is boron and the first level of concentration of the doping material is from about 5e19 atoms per $cm^3$ to about 2e20 atoms per cubic centimeter.

6. The method of claim 3, wherein the second ratio of the atomic concentration of the first element to the atomic concentration of the second element is about 3.0 to 1.

7. The method of claim 3, wherein the doping material is boron and the second level of concentration of the doping material is from about 2e20 atoms per $cm^3$ to 5e20 atoms per cubic centimeter.

8. The method of claim 3, wherein the third ratio of the atomic concentration of the first element to the atomic concentration of the second element is about 2.3 to 1.

9. The method of claim 3, wherein the doping material is boron and the third level of concentration of the doping material is in a range from about 5e20 atoms per $cm^3$ to 1e21 atoms per $cm^3$.

10. A method for forming a semiconductor device comprising:
    forming a recess in a source region and a recess in a drain region of the semiconductor device;
    forming a first semiconductor material layer in the recess in the source region and a second semiconductor material layer in the recess in the drain region, wherein each of the first semiconductor material layer and the second semiconductor material layer are formed using a stressor material having a first ratio of an atomic concentration of a first element and an atomic concentration of a second element, wherein the first element is silicon and wherein each of the first semiconductor material layer and the second semiconductor material layer have a first level of concentration of a doping material;
    forming a third semiconductor material layer overlying the first semiconductor material layer and a fourth semiconductor material layer overlying the second semiconductor material layer, wherein each of the third semiconductor material layer and the fourth semiconductor material layer have a second level of concentration of the doping material, wherein the second level of concentration of the doping material is higher than the first level of concentration of the doping material; and
    forming a fifth semiconductor material layer overlying the third semiconductor material layer and a sixth semiconductor material layer overlying the fourth semiconductor material layer, wherein each of the fifth semiconductor material layer and the sixth semiconductor material layer have a third level of concentration of the doping material, wherein the third level of concentration of the doping material is higher than the second level of concentration of the doping material.

11. The method of claim 10, wherein the doping material is one or more of a group V element.

12. The method of claim 11, wherein the doping material is boron and the first level of concentration of the doping material is from about 5e19 atoms per $cm^3$ to about 2e20 atoms per $cm^3$.

13. The method of claim 11, wherein the second level of concentration of the doping material is from about 2e20 atoms per $cm^3$ to 5e20 atoms per $cm^3$.

14. The method of claim 11, wherein the third level of concentration of the doping material is in a range from about 5e20 atoms per $cm^3$ to 1e21 atoms per $cm^3$.

15. A semiconductor device comprising:

a first semiconductor material layer in a recess in a source region and a second semiconductor material layer in a recess in a drain region, wherein each of the first semiconductor material layer and the second semiconductor material layer are formed using a stressor material having a first ratio of an atomic concentration of a first element and an atomic concentration of a second element and a first level of concentration of a doping material, wherein the first element is silicon;

a third semiconductor material layer overlying the first semiconductor material layer and a fourth semiconductor material layer overlying the second semiconductor material layer, wherein each of the third semiconductor material layer and the fourth semiconductor material layer have a second ratio of the atomic concentration of the first element and the atomic concentration of the second element, wherein the second ratio is higher than the first ratio and wherein each of the third semiconductor material layer and the fourth semiconductor material layer have a second level of concentration of the doping material, wherein the second level of concentration of the doping material is higher than the first level of concentration of the doping material; and a fifth semiconductor material layer overlying the third semiconductor material layer and a sixth semiconductor material layer overlying the fourth semiconductor material layer, wherein each of the fifth semiconductor material layer and the sixth semiconductor material layer have a third ratio of the atomic concentration of the first element and the atomic concentration of the second element, wherein the third ratio is lower than the second ratio and wherein each of the fifth semiconductor material layer and the sixth semiconductor material layer have a third level of concentration of the doping material, wherein the third level of concentration of the doping material is higher than the second level of concentration of the doping material.

16. The semiconductor device of claim 15, wherein the stressor material is an alloy of silicon and germanium such that the second element is germanium.

17. The semiconductor device of claim 15, wherein the doping material is one or more of a group V.

18. The semiconductor device of claim 17, wherein the first ratio of the atomic concentration of the first element to the atomic concentration of the second element is about 2.3 to 1.

19. The semiconductor device of claim 17, wherein the doping material is boron and the first level of concentration of the doping material is from about 5e19 atoms per $cm^3$ to about 2e20 atoms per $cm^3$, the second level of concentration of the doping material is from about 2e20 atoms per $cm^3$ to 5e20 atoms per $cm^3$, and the third level of concentration of the doping material is in a range from about 5e20 atoms per $cm^3$ to 1e21 atoms per $cm^3$.

20. The semiconductor device of claim 17, wherein the second ratio of the atomic concentration of the first element to the atomic concentration of the second element is about 3.0 to 1.

* * * * *